United States Patent [19]

Hall et al.

[11] Patent Number: 4,885,056
[45] Date of Patent: Dec. 5, 1989

[54] METHOD OF REDUCING DEFECTS ON SEMICONDUCTOR WAFERS

[75] Inventors: James B. Hall, Chandler; Sumner Sheff, Scottsdale, both of Ariz.

[73] Assignee: Motorola Inc., Schaumburg, Ill.

[21] Appl. No.: 378,510

[22] Filed: Jul. 12, 1989

Related U.S. Application Data

[63] Continuation of Ser. No. 239,889, Sep. 2, 1988, abandoned.

[51] Int. Cl.$^4$ .......................................... H01L 21/306
[52] U.S. Cl. ................................... 156/662; 252/79.2; 252/79.3
[58] Field of Search ............... 156/662; 252/79.2, 79.3

[56] References Cited

U.S. PATENT DOCUMENTS

| | | |
|---|---|---|
| 3,669,774 | 6/1972 | Dismukes . |
| 4,180,422 | 12/1979 | Rosvold ............................ 156/662 |
| 4,397,711 | 8/1983 | Donnelly et al. ................... 156/662 |
| 4,595,454 | 6/1986 | Dautremont-Smith et al. ... 156/662 |
| 4,704,188 | 11/1987 | Carlson et al. ..................... 156/662 |

OTHER PUBLICATIONS

Kern, "Purifying Si and $SiO_2$ Surface with Hydrogen Peroxide" Semiconductor International, Apr. 84, pp. 84–99.

Gould et al., "The Influence of Silicon Surface Cleaning Procedures on Silicon Oxidation".

J. Electrochem Soc. Solid State Science and Technology, vol. 134, No. 4, Apr. 87, pp. 1031–1033.

Mikata et al., "Thermal Cleaning of Si Surface in Ultra-High Vacuum" Proc. Electrochem Soc. Extended Abstracts, 85-7, Dec. 9, 1987, pp. 45–56.

Wolf et al., Silicon Processing for the VSLI Era, vol. 1, Lattice Press, Calif. 1986, pp. 514–520.

Primary Examiner—David L. Lacey
Assistant Examiner—Lori-Ann Johnson
Attorney, Agent, or Firm—Robert M. Handy

[57] ABSTRACT

A reduction in the number of impurities and defects on a semiconductor wafer is provided by cleaning the wafer in a hydrochloric acid, hydrofluoric acid, and water solution. This $HCl{:}HF{:}H_2O$ solution removes silicon dioxide as well as metallic impurities from the wafer surface, thus preventing the formation of defects on the wafer and increasing the quality and yield of semiconductor devices.

11 Claims, 1 Drawing Sheet

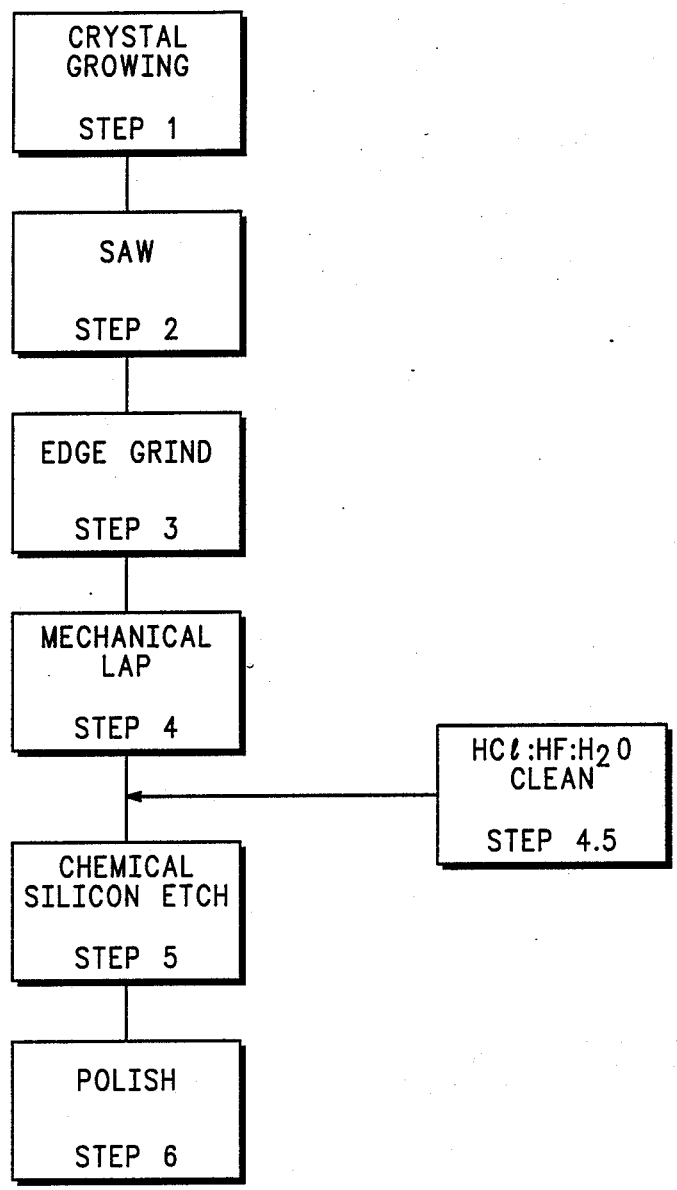

METHOD OF REDUCING DEFECTS ON SEMICONDUCTOR WAFERS

This application is a continuation of prior application Ser. No. 7/239,889, filed Sept. 2, 1988 now abandoned.

BACKGROUND OF THE INVENTION

This invention relates, in general, to fabricating semiconductor wafers, and more particularly, to a method of reducing the number of defects on semiconductor wafers.

The importance of improving quality is well known in any manufacturing industry. In all steps of semiconductor device manufacturing, care must be taken to ensure that contaminants or impurities are not present on the semiconductor wafer. Cleaning steps are commonly instituted at various places in the manufacture of semiconductor devices to remove impurities which can eventually cause defects. Presently, a solution of hydrochloric acid and peroxide is used by some manufacturers to remove impurities and residue. Another common cleaning solution is hydrofluoric acid and water or buffered hydrofluoric acid and water. A method to remove surface damaged material and give a smooth surface is disclosed in U.S. Pat. No. 3,669,774, issued to Dismukes on June 13, 1972. Here a mechanically polished silicon wafer is etched to prepare the surface for epitaxial silicon growth thereon. The silicon etch takes place at a temperature of approximately 800° to 1050° C., with a gas mixture consisting of $H_2$ and/or He, and a small concentration of a gas reactive with $SiO_2$ such as HF, $ClF_3$, or $BrF_5$, and a small concentration of a gas reactive with silicon such as HBR, HI, HCl, $Cl_2$, $Br_2$, or $I_2$. This process is somewhat limited in that the temperature must be elevated between 800° and 1050° C. and because gases are used, the reaction must take place in an enclosed reactor.

The struggle to remove impurities in semiconductor device manufacture begins with the fabrication of single crystal silicon. Silicon crystals or ingots are sliced, lapped and polished to form wafers. In the process of shaping these wafers, impurities and defects may be incorporated into and on the silicon wafer. These defects may cause failures in the semiconductor devices. The removal of the impurities and defects would not only increase the number of good wafers produced, but also increase the number of good devices fabricated per wafer. A simple method of removing impurities that can be carried out at room temperature is desirable.

By now it should be appreciated that it would be advantageous to provide a process that reduces the amount of defects on semiconductor wafers, thus improving the quality and yield of semiconductor devices.

Accordingly, it is an object of the present invention to provide a method to remove the impurities from semiconductor wafer surfaces.

Another object of the present invention is to provide a method to reduce the number of defects on semiconductor wafers.

A further object of the present invention is to provide a method that imporves the quality and yield of semiconductor devices.

SUMMARY OF THE INVENTION

In accordance with the present invention, the above and other objects and advantages are provided by cleaning semiconductor wafers with a solution of hydrochloric acid, hydrofluoric acid, and water. This cleaning step removes silicon dioxide and impurities present on the semiconductor wafer. Thus, fewer defects are formed on the wafer surface and semiconductor device yield is increased.

BRIEF DESCRIPTION OF THE DRAWINGS

The single FIGURE illustrates a flowchart of a process in which the present invention may be used.

The preferred embodiment of the invention is illustrated in the accompanying drawing for purposes of exemplification, and is not to be construed as limiting in any manner.

DETAILED DESCRIPTION OF THE DRAWINGS

The single FIGURE shown illustrates a process flow in which the present invention may be utilized. The process flow illustrates the major steps in the semiconductor crystal growing and wafer shaping operations. Some minor steps, such as detergent cleans and deionized water rinses, have not been illustrated. Step 1 illustrates the growth of a semiconductor crystal or ingot using standard techniques known in the industry. In this embodiment, the semiconductor crystal is silicon. Next, step 2 illustrates the slicing of the ingot into wafers; this is accomplished with a diamoond blade or free-slurry wire saw. In the next step, illustrated as step 3, the edges of the wafer are ground. This is done to prevent the edges of a wafer from chipping during device fabrication. Next, as illustrated in step 4, the wafers are then mechanically lapped on both sides to obtain a uniform thickness and to improve the wafer flatness. The wafers are lapped between iron plates using a mixture of aluminum oxide and a suspension agent. Typically, approximately 20 microns per side of silicon is removed in this lapping operation. These shaping operations; steps 2–4, saw, edge grind, and lap, leave the wafer surface damaged and contaminated. The damage to the silicon crystal at the wafer surface comes primarily from edge grind step 3, and mechanical lap step 4. In addition, some metallic impurities are introduced by lapping operation step 4.

The damage to the silicon crystal typically extends into the wafer approximately 10–20 microns from the wafer surfaces. The damaged silicon is removed chemically by using a silicon etch, which is illustrated as step 5. Two solutions are commonly used in the industry for chemically removing the damaged silicon; an acidic etch comprising hydrofluoric, nitric, and acetic acids; or a caustic etch comprising potassium or sodium hydroxide.

This silicon etch step 5 also removes some of the contamination and residue, however, does not remove all metallic impurities from the wafer surface. These impurities are the cause of defects that appear on the wafer surface after the damaged silicon is removed in step 5. The defects formed are silicon spikes, surface dimple defects, and discoloration of the semiconductor wafer surface.

Surface spikes are believed to be caused by metallic impurities left on the wafer from previous operations. After lapping, a native oxide grows on the wafer surface, trapping the impurities on the wafer. Silicon etch step 5 does not etch these impurities, and therefore, the silicon is not etched uniformly in the places where there are impurities present. After the completion of etch step 5, mesas or spikes of silicon are left on the wafer where the impurities were present. After silicon etch step 5, one side of the wafer is polished, as illustrated in step 6, to provide a smooth surface where the semiconductor device can be fabricated. During the polish, any silicon spikes present on the side of the wafer that is not polished will cause a surface dimple to be formed on the polished side of the wafer. In addition, a discoloration of the wafer surface is also formed when the silicon can not be etched (during step 5) uniformly across the wafer due to impurities that cannot be etched or etched at the same rate as the silicon. It is also desirable to remove the metallic impurities from the wafer because device failure may occur if the impurities diffuse to the active device area during the fabrication of the semiconductor devices. A detergent cleaning operation is done after mechanical lap step 4 (not shown), but does not clean the wafer surfaces of impurities sufficiently.

In order to remove the impurities and prevent the defects from forming, a cleaning step, shown as step 4.5 is inserted between mechanical lap step 4 and chemical silicon etch step 5. A hydrochloric acid, hydrofluoric acid, and water (HCl:HF:H$_2$O) solution provides the necessary chemicals to remove the impurities left on the wafer after mechanical lap step 4. The HF acid etches a thin layer of silicon dioxide that forms on the wafer, while the HCl acid removes metallic impurities and other contaminants. In a preferred embodiment, the concentration of the HCl acid is approximately 37%, the concentration of the HF acid is approximately 49%, and the ratio of HCl:HF:H$_2$O is approximately 1:1:5 parts by volume, respectively. The necessary time for removing the impurities at the surface is approximately two minutes. A weaker solution can be used, however, the etch time would lengthen and the acids may be depleted too quickly for optimum mass production. A stronger solution (without additional water) may also be used, however, it is not necessary. Cleaning step 4.5 is preferably done at room temperature, however, it will also work at an elevated temperature.

A neutron activation analysis (NAA) was performed on wafers with and without the new HCl:HF:H$_2$O cleaning step 4.5. It was found that the metallic impurity levels were reduced, for example, copper was reduced by a factor of 2, sodium by 4, chromium by 6, and iron by 14 with the addition of the HCl:HF:H$_2$O clean.

Experimentation was also conducted employing a HF:H$_2$O clean followed by a separate HCl:H$_2$O clean. Etching a wafer with HF acid and then with HCl acid separately does remove some impurities, however, it was found that the HCl and HF acids together provided for the most optimum removal of impurities.

The present invention is also useful in other steps during the semiconductor device manufacturing process. Those skilled in the art will readily recognize the advantage of using the cleaning solution disclosed as it applies to semiconductor device manufacture. The simplicity and ease of using the present invention provides for a higher quality product, while not adding any significant cost to the manufacturing process.

By now it should be appreciated that there has been provided a new and improved process that improves the quality of the wafers and the yield of resulting semiconductor devices.

We claim:

1. A method of cleaning a silicon semiconductor wafer comprising: subjecting the wafer to a solution comprising hydrochloric acid and hydrofluoric acid to simultaneously remove impurities and a native oxide from the wafer.

2. The method of claim 1 wherein the solution is further comprised of water, and wherein hydrochloric acid of approximately 37% concentration, hydrofluoric acid of approximately 49% concentration, and water are mixed in a ratio of approximately 1:1:5 parts by volume to form the solution.

3. A method of cleaning a silicon semiconductor wafer comprising mechanically lapping the wafer and then subjecting the wafer to a solution comprising hydrochloric acid and hydrofluoric acid to simultaneously remove impurities and a native oxide from the wafer.

4. The method of claim 3 wherein the wafer is subjected to the solution prior to chemically etching the wafer to remove a predetermined amount of the wafer.

5. The method of claim 3 wherein the solution is further comprised of water, and wherein hydrochloric acid of approximately 37% concentration, hydrofluoric acid of approximately 49% concentration, and water are mixed in a ratio of approximately 1:1:5 parts by volume to form the solution.

6. A method of reducing the amount of metallic impurities on a silicon semiconductor wafer comprising, in the order specified, the steps of:
   mechanically lapping the wafer to remove a predetermined amount of the wafer;
   immersing the wafer in a bath of hydrochloric acid, hydrofluoric acid, and water; and
   chemically etching the wafer to remove a predetermined amount of the wafer.

7. The method of claim 6 wherein the bath comprises hydrochloric acid of approximately 37% concentration, hydrofluoric acid of approximately 49% concentration, and water mixed in a ratio of approximately 1:1:5 parts by volume.

8. The method of claim 6 wherein said chemically etching the wafer is performed by using a caustic or acidic chemical etch.

9. The method of claim 6 wherein the wafer is immersed in the bath for approximately 2 minutes.

10. A method of cleaning a silicon semiconductor wafer comprising the steps of thinning the wafer and then subjecting the wafer to a hydrofluoric acid, hydrochloric acid, and water solution at room temperature to simultaneously remove impurities and a native oxide from the wafer.

11. A method of cleaning a silicon semiconduuctor wafer following a mechanical lapping of the wafer comprising subjecting the wafer to a solution comprising hydrochloric acid, hydrofluoric acid, and water to simultaneously remove impurities and a native oxide from the surface.

* * * * *